(12) United States Patent
Flynn et al.

(10) Patent No.: US 8,514,885 B2
(45) Date of Patent: Aug. 20, 2013

(54) USING VARIABLE LENGTH PACKETS TO EMBED EXTRA NETWORK CONTROL INFORMATION

(75) Inventors: William Thomas Flynn, Rochester, MN (US); David Alan Shedivy, Rochester, MN (US); Kenneth Michael Valk, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 714 days.

(21) Appl. No.: 12/749,812

(22) Filed: Mar. 30, 2010

(65) Prior Publication Data
US 2011/0243154 A1 Oct. 6, 2011

(51) Int. Cl.
| | |
|---|---|
| H04J 3/16 | (2006.01) |
| H04J 3/22 | (2006.01) |
| H04J 1/16 | (2006.01) |
| H04J 3/14 | (2006.01) |
| H04L 1/00 | (2006.01) |
| H04L 12/26 | (2006.01) |

(52) U.S. Cl.
USPC ............ 370/471; 370/229; 370/230; 370/231

(58) Field of Classification Search
USPC ................ 370/216, 219–220, 235, 229, 230, 370/230.1, 231, 232, 241, 242, 252, 254, 370/257, 328, 329, 330, 332, 333, 338, 342, 370/345, 350, 355, 359, 362, 363, 364, 369, 370/386, 389, 392, 395, 395.21, 395.3, 395.4, 370/395.42, 395.43, 401, 402, 406, 412–420, 370/422, 429, 465, 468, 469, 471, 476, 503, 370/509, 519, 535, 537; 709/200, 201, 204, 709/205, 206, 209, 217, 220, 221, 222, 223, 709/224, 227–237, 238, 248, 249, 250
See application file for complete search history.

(56) References Cited

U.S. PATENT DOCUMENTS 6,266,342 B1 * 7/2001 Stacey et al. .................. 370/465

* cited by examiner

*Primary Examiner* — Kwang B Yao
*Assistant Examiner* — Adam Duda
(74) *Attorney, Agent, or Firm* — Joan Pennington

(57) ABSTRACT

A method and circuit for implementing variable length packets to embed extra control information in an interconnect system, and a design structure on which the subject circuit resides are provided. Packets are defined to include an End-to-End (ETE) Flow Unit within packet (Flit) count field in the packet header. The packet header also includes its own CRC field. When a nonzero ETE flit count field is received in an incoming packet from an incoming link, the specified number of embedded ETE flits is removed from the packet and is used the same as if the control information arrived in its own packet.

24 Claims, 10 Drawing Sheets

USING VARIABLE LENGTH PACKETS TO EMBED EXTRA NETWORK CONTROL INFORMATION

FIELD OF THE INVENTION

The present invention relates generally to the data processing field, and more particularly, relates to a method and circuit for implementing variable length packets to embed extra control information in an interconnect system, and a design structure on which the subject circuit resides.

DESCRIPTION OF THE RELATED ART

In typical network configurations, extra information must be transferred on links to maintain proper operation. This information includes various control information, such as credits and verification acknowledgements, heartbeats, and sequence information. The control information usually flows independently of data packets. The control information must be transferred even if no data packets are ready to be sent. The control information is critical, so it must be protected by an error detecting code, such as, a cyclic redundancy check (CRC).

If this control information is only transferred within its own control packet, the overhead required is the actual control information plus the normal packet overhead including header and tail information.

A need exists for an effective method and circuit to implement transmission of control information in a local rack interconnect system.

SUMMARY OF THE INVENTION

Principal aspects of the present invention are to provide a method and circuit for implementing variable length packets to embed extra control information in an interconnect system, and a design structure on which the subject circuit resides. Other important aspects of the present invention are to provide such method, circuitry, and design structure substantially without negative effect and that overcome many of the disadvantages of prior art arrangements.

In brief, a method and circuit for implementing variable length packets to embed extra control information in an interconnect system, and a design structure on which the subject circuit resides are provided. Packets are defined to include an End-to-End (ETE) Flow Unit within packet (Flit) count field in the packet header. When a nonzero ETE flit count field is received in an incoming packet from an incoming link, the specified number of embedded ETE flits is removed from the packet and control information from the removed embedded ETE flits is used.

In accordance with features of the invention, the packet header also includes its own CRC field. The ETE flits are transferred without the bandwidth required for a separate header and tail, and are verified earlier than if sent in a subsequent packet. Optionally a separate CRC flit is sent along with the embedded ETE flits, that covers only the embedded ETE flits.

In accordance with features of the invention, configuration settings include a maximum flits allowed to be embedded for each packet type, and whether embedded flits include a cyclic redundancy check (CRC).

In accordance with features of the invention, by providing control information selectively embedded within data packets, less bandwidth is consumed and latency is improved.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, circuits and methods are provided for implementing variable length packets to embed extra control information in a multiple-path local rack interconnect system.

Figure 1A:
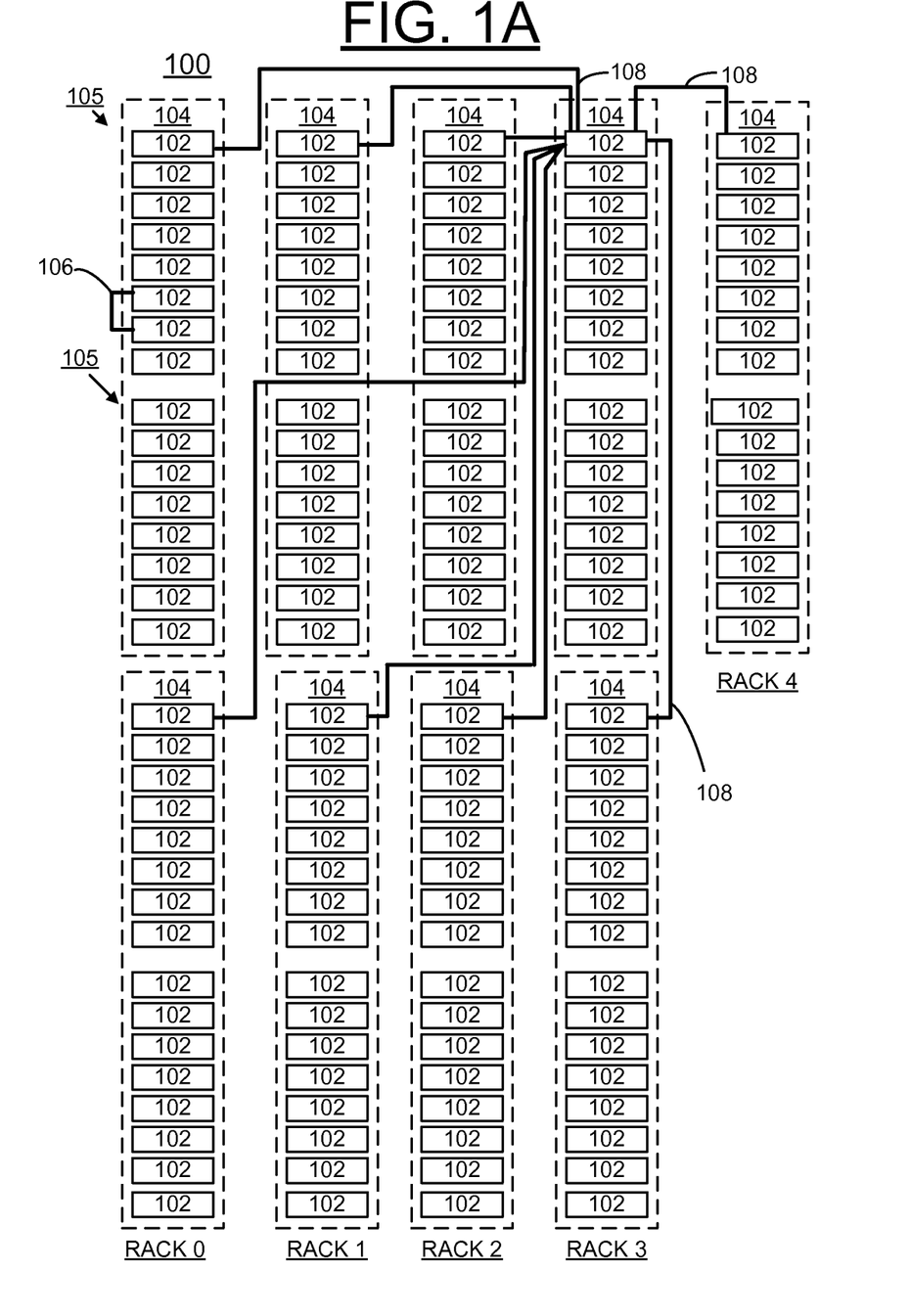
FIGS. 1A, 1B, 1C, 1D, and 1E are respective schematic and block diagrams illustrating an exemplary a local rack interconnect system for implementing variable length packets to embed extra control information in accordance with the preferred embodiment.

Having reference now to the drawings, in FIG. 1A, there is shown an example multiple-path local rack interconnect system generally designated by the reference character 100 used for implementing variable length packets to embed extra control information in accordance with the preferred embodiment. The multiple-path local rack interconnect system 100 supports computer system communications between multiple servers, and enables an Input/Output (IO) adapter to be shared across multiple servers. The multiple-path local rack interconnect system 100 supports network, storage, clustering and Peripheral Component Interconnect Express (PCIe) data traffic.

The multiple-path local rack interconnect system 100 includes a plurality of interconnect chips 102 in accordance with the preferred embodiment arranged in groups or super nodes 104. Each super node 104 includes a predefined number of interconnect chips 102, such as 16 interconnect chips, arranged as a chassis pair including a first and a second chassis group 105, each including 8 interconnect chips 102. The multiple-path local rack interconnect system 100 includes, for example, a predefined maximum number of nine super nodes 104. As shown, a pair of super nodes 104 are provided within four racks or racks 0-3, and a ninth super node 104 is provided within the fifth rack or rack 4.

In FIG. 1A, the multiple-path local rack interconnect system 100 is shown in simplified form sufficient for understanding the invention, with one of a plurality of local links (L-links) 106 shown between a pair of the interconnect chips 102 within one super node 104. The multiple-path local rack interconnect system 100 includes a plurality of L-links 106 connecting together all of the interconnect chips 102 of each super node 104. A plurality of distance links (D-links) 108, or as shown eight D-links 108 connect together the example nine super nodes 104 together in the same position in each of the other chassis pairs. Each of the L-links 106 and D-links 108 comprises a bi-directional (×2) high-speed serial (HSS) link.

Figure 1B:
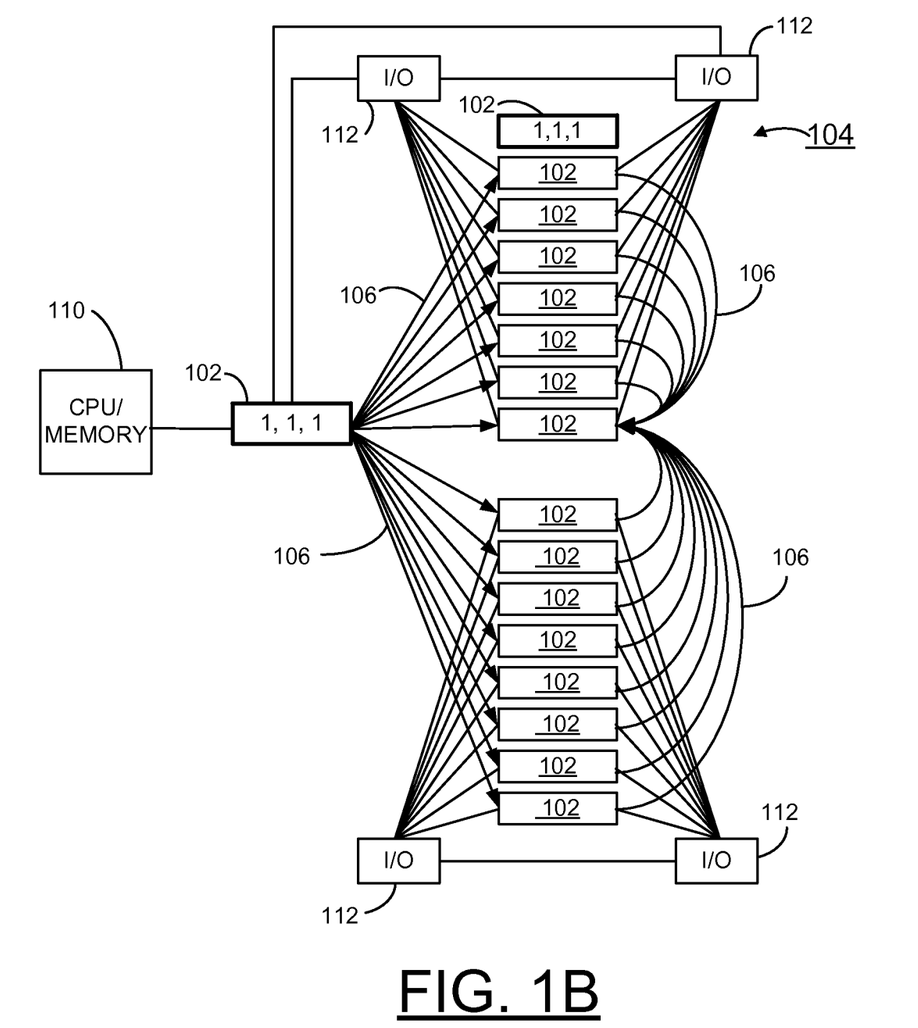
Figure 1C:
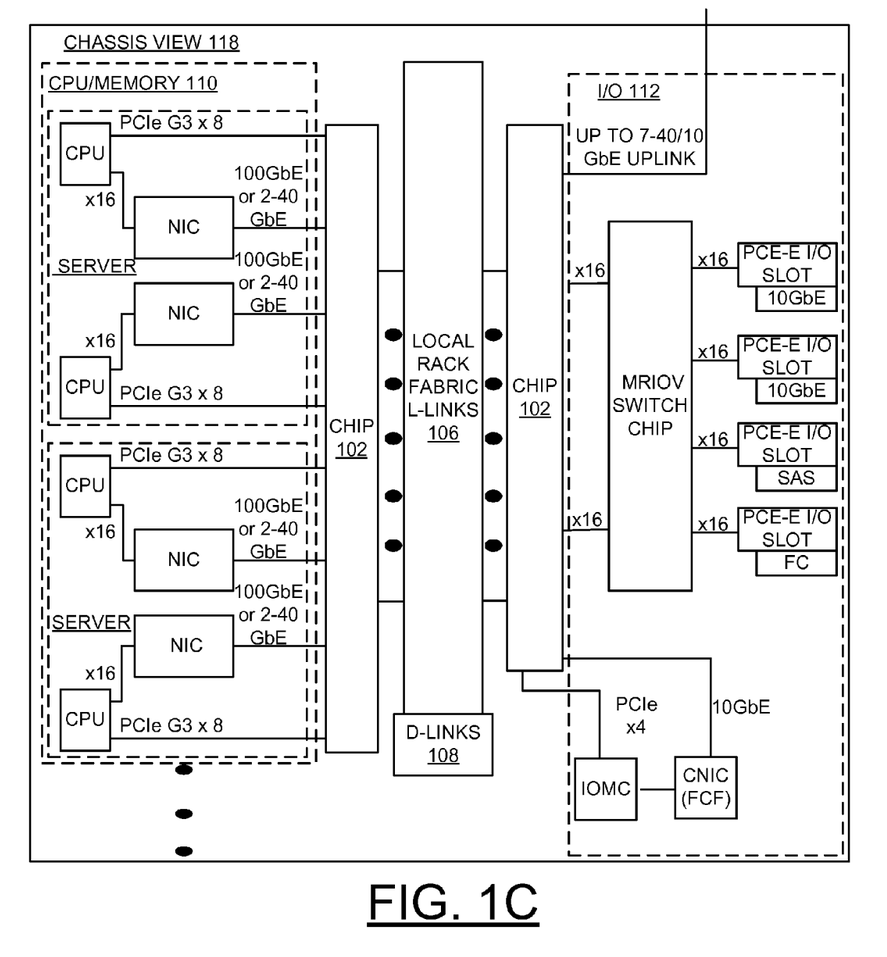
Figure 1D:
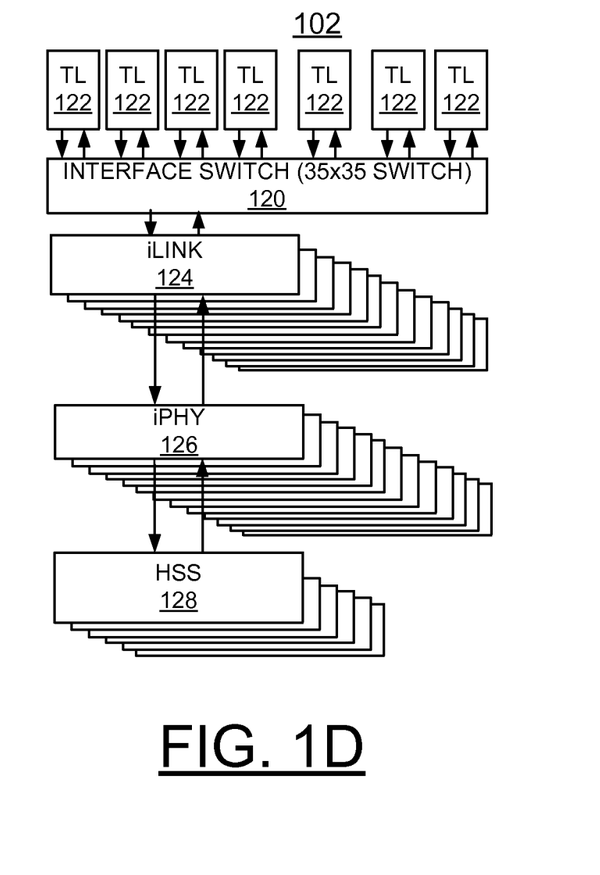
Figure 1E:
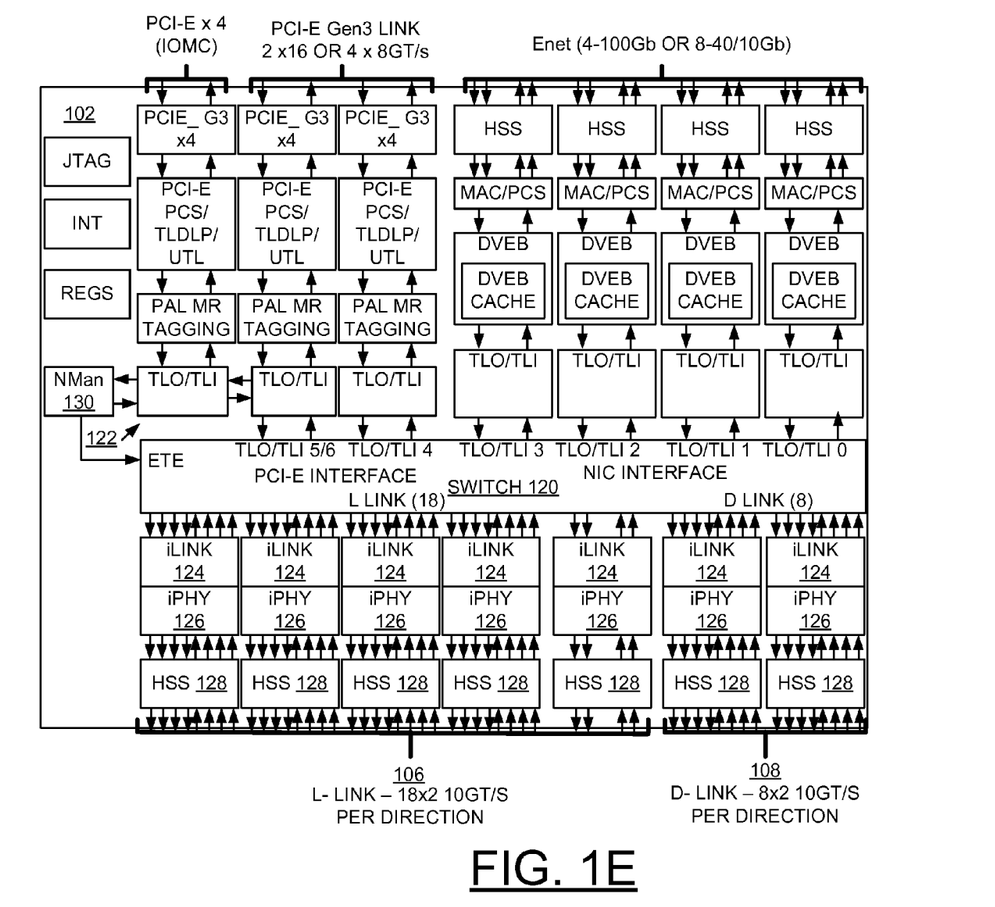

Referring also to FIG. 1E, each of the interconnect chips 102 of FIG. 1A includes, for example, 18 L-links 106, labeled 18 ×2 10 GT/S PER DIRECTION and 8 D-links 108, labeled 8 ×2 10 GT/S PER DIRECTION.

Referring also to FIGS. 1B and 1C, multiple interconnect chips 102 defining a super node 104 are shown connected together in FIG. 1B. A first or top of stack interconnect chip 102, labeled 1,1,1 is shown twice in FIG. 1B, once off to the side and once on the top of the stack. Connections are shown to the illustrated interconnect chip 102, labeled 1,1,1 positioned on the side of the super node 104 including a plurality of L-links 106 and a connection to a device 110, such as a central processor unit (CPU)/memory 110. A plurality of D links 108 or eight D-links 108 as shown in FIG. 1A, (not shown in FIG. 1B) are connected to the interconnect chips 102, such as interconnect chip 102, labeled 1,1,1 in FIG. 1B.

As shown in FIG. 1B, each of a plurality of input/output (I/O) blocks 112, is connected to respective interconnect chips 102, and respective ones of the I/O 112 are connected together. A source interconnect chip 102, such as interconnect chip 102, labeled 1,1,1 transmits or sprays all data traffic across all L-links 106. A local I/O 112 may also use a particular L-link 106 of destination I/O 112. For a destination inside a super node 104, or chassis pair of first and second chassis group 105, a source interconnect chip or an intermediate interconnect chip 102 forwards packets directly to a destination interconnect chip 102 over an L-link 106. For a destination outside a super node 104, a source interconnect chip or an intermediate interconnect chip 102 forwards packets to an interconnect chip 102 in the same position on the destination super node 104 over a D-link 108. The interconnect chip 102 in the same position on the destination super node 104 forwards packets directly to a destination interconnect chip 102 over an L-link 106.

In the multiple-path local rack interconnect system 100, the possible routing paths with the source and destination interconnect chips 102 within the same super node 104 include a single L-link 106; or a pair of L-links 106. The possible routing paths with the source and destination interconnect chips 102 within different super nodes 104 include a single D-link 108 (D); or a single D-link 108, and a single L-link 106 (D-L); or a single L-link 106, and single D-link 108 (L-D); or a single L-link 106, a single D-link 108, and a single L-link 106 (L-D-L). With an unpopulated interconnect chip 102 or a failing path, either the L-link 106 or D-link 108 at the beginning of the path is removed from a spray list at the source interconnect 102.

As shown in FIGS. 1B and 1C, a direct path is provided from the central processor unit (CPU)/memory 110 to the interconnect chips 102, such as chip 102, labeled 1,1,1 in FIG. 1B, and from any other CPU/memory connected to another respective interconnect chip 102 within the super node 104.

Referring now to FIG. 1C, a chassis view generally designated by the reference character 118 is shown with a first of a pair of interconnect chips 102 connected a central processor unit (CPU)/memory 110 and the other interconnect chip 102 connected to input/output (I/O) 112 connected by local rack fabric L-links 106, and D-links 108. Example connections shown between each of an illustrated pair of servers within the CPU/memory 110 and the first interconnect chip 102 include a Peripheral Component Interconnect Express (PCIe) G3 ×8, and a pair of 100 GbE or 2-40 GbE to a respective Network Interface Card (NIC). Example connections of the other interconnect chip 102 include up to 7-40/10 GbE Uplinks, and example connections shown to the I/O 112 include a pair of PCIe G3×16 to an external MRIOV switch chip, with four ×16 to PCI-E I/O Slots with two Ethernet slots indicated 10 GbE, and two storage slots indicated as SAS (serial attached SCSI) and FC (fibre channel), a PCIe ×4 to a IOMC and 10 GbE to CNIC (FCF).

Referring now to FIGS. 1D and 1E, there are shown block diagram representations illustrating an example interconnect chip 102. The interconnect chip 102 includes an interface switch 120 connecting a plurality of transport layers (TL) 122, such as 7 TLs, and interface links (iLink) layer 124 or 26 iLinks. An interface physical layer protocol, or iPhy 126 is coupled between the interface links layer iLink 124 and high speed serial (HSS) interface 128, such as 7 HSS 128. As shown in FIG. 1E, the 7 HSS 128 are respectively connected to the illustrated 18 L-links 106, and 8 D-links 108. In the example implementation of interconnect chip 102, 26 connections including the illustrated 18 L-links 106, and 8 D-links 108 to the 7 HSS 128 are used, while the 7 HSS 128 would support 28 connections.

The TLs 122 provide reliable transport of packets, including recovering from broken chips 102 and broken links 106, 108 in the path between source and destination. For example, the interface switch 120 connects the 7 TLs 122 and the 26 iLinks 124 in a crossbar switch, providing receive buffering for iLink packets and minimal buffering for the local rack interconnect packets from the TLO 122. The packets from the TL 122 are sprayed onto multiple links by interface switch 120 to achieve higher bandwidth. The iLink layer protocol 124 handles link level flow control, error checking CRC generating and checking, and link level retransmission in the event of CRC errors. The iPhy layer protocol 126 handles training sequences, lane alignment, and scrambling and descrambling. The HSS 128, for example, are 7 ×8 full duplex cores providing the illustrated 26 ×2 lanes.

In FIG. 1E, a more detailed block diagram representation illustrating the example interconnect chip 102 is shown. Each of the 7 transport layers (TLs) 122 includes a transport layer out (TLO) partition and transport layer in (TLI) partition. The TLO/TLI 122 respectively receives and sends local rack interconnect packets from and to the illustrated Ethernet (Enet), and the Peripheral Component Interconnect Express (PCI-E), PCI-E ×4, PCI-3 Gen3 Link respectively via network adapter or fabric adapter, as illustrated by blocks labeled high speed serial (HSS), media access control/physical coding sub-layer (MAC/PCS), distributed virtual Ethernet bridge (DVEB); and the PCIE_G3 ×4, and PCIE_G3 2×8, PCIE_G3 2×8, a Peripheral Component Interconnect Express (PCIe) Physical Coding Sub-layer (PCS) Transaction Layer/Data/Link Protocol (TLDLP) Upper Transaction Layer (UTL), PCIe Application Layer (PAL MR) TAGGING to and from the interconnect switch 120. A network manager (NMan) 130 coupled to interface switch 120 uses End-to-End (ETE) small control packets for network management and control functions in multiple-path local rack interconnect system 100. The interconnect chip 102 includes JTAG, Interrupt Handler (INT), and Register partition (REGS) functions.

In accordance with features of the invention, methods and circuits are provided to enable control information to be optionally embedded within data packets, so that less bandwidth is consumed and latency is improved. Packets are defined to include an ETE (End-to-End) Flit (Flow Unit within packet) Count field in the packet header. ETE messages, which contain control information, are converted into ETE flits, such as 40-bit flits, that are selectively embedded into the variable length packets. The packet header also includes its own CRC field including a packet header CRC. If a nonzero ETE flit count field is received, the specified number of embedded ETE flits, which contain control information, is removed from the packet and treated the same as if the information arrived in its own packet when the whole packet is verified for correctness. These ETE flits are transferred without the bandwidth required for a separate header and tail, and are verified earlier than if sent in a subsequent control packet. Optionally, the sender and receiver circuits are programmed to include a separate CRC flit along with the embedded ETE flits, with this CRC covering only those embedded ETE flits. In this case, the bandwidth improvement is less, but latency for the embedded ETE flits is better because they can be verified and processed before the complete packet has arrived.

Figure 2:
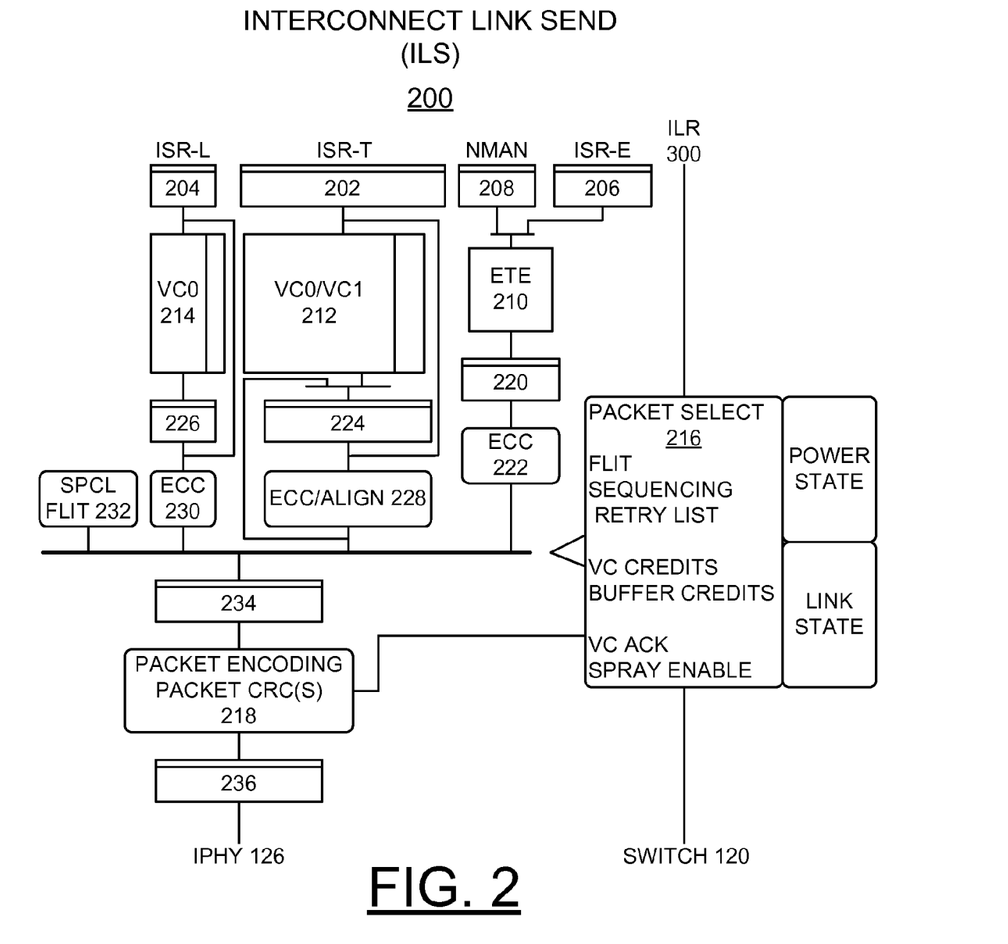
FIGS. 2 and 3 are respective schematic and block diagrams illustrating a respective link layer logic receive circuit and a link layer send logic circuit for implementing variable length packets to embed extra control information in accordance with the preferred embodiment.
Figure 3:
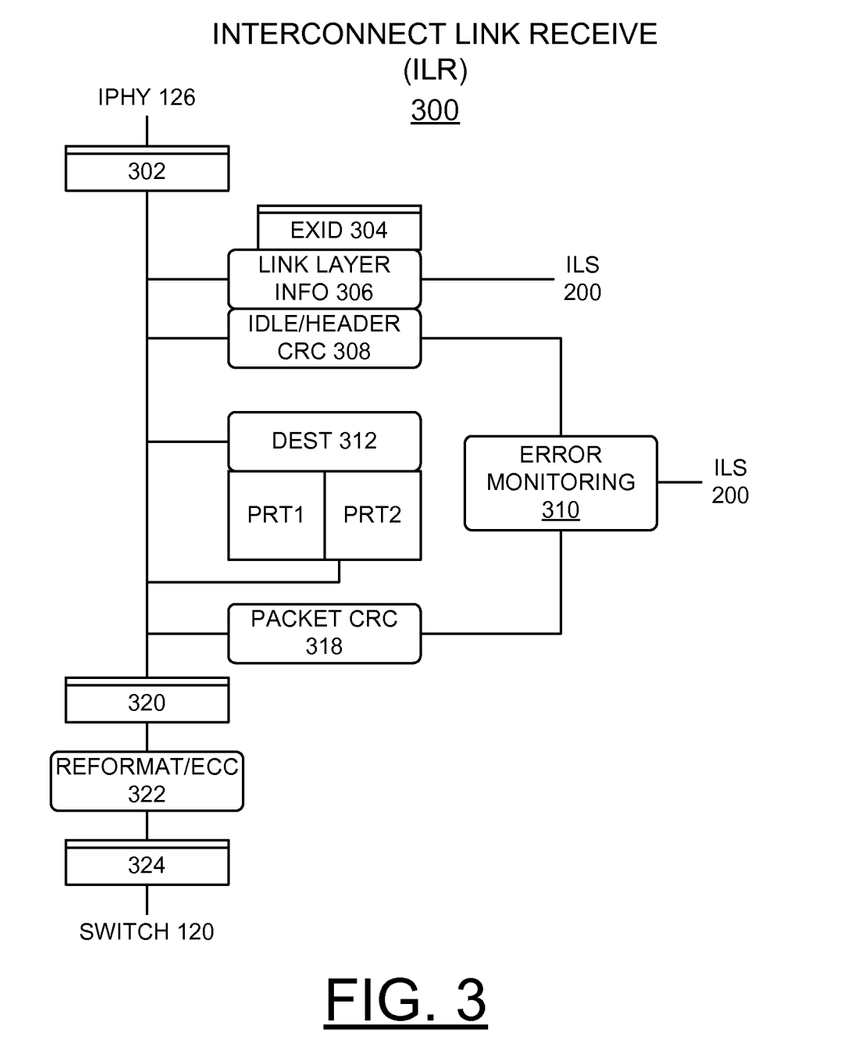

Referring now to FIGS. 2 and 3 are shown a respective interconnect link layer logic send (ILS) circuit and an interconnect link layer receive (ILR) logic circuit generally designated by the reference character 200, 300 for implementing variable length packets to embed extra control information in accordance with the preferred embodiment.

The ILS circuit 200 handles sending or transmitting all flits on the L and D links 106, 108. The ILS circuit 200 handles loading the buffers with packet data and creating the complete link layer packets for transmission, and handles remote link CRC errors by detecting lost acknowledgements and re-transmitting required packets.

Referring to FIG. 2, the interconnect link layer logic send (ILS) circuit 200 includes an interconnect switch TL interface 202, an interconnect switch LL interface 204, an interconnect switch ETE interface 206, and an network manager NMan interface 208. The ILS circuit 200 includes an ETE buffer 210 coupled to the interconnect switch ETE interface 206, and the network manager NMan interface 208. A respective transmit buffer 212, 214 is coupled to the interconnect switch TL interface 202, and the interconnect switch LL interface 204. The link layer logic send (ILS) circuit 200 includes a packet select 216 with link layer controls and a packet encoder 218 with packet CRC or CRCs generator. The packet select 216 is coupled to the ILR 300 and switch 120. The ETE buffer 210 is coupled to an interface 220 to an error correcting code (ECC) checking and correction block 222 coupled to the packet select 216. The respective buffers 212, 214 are coupled via a respective interface 224 and 226 to an ECC/align checking and correction block 228 and ECC checking and correction block 230 and coupled to the packet select 216. The ILS 200 includes a special Flit 232 coupled to the packet select 216. The packet encoder 218 with packet CRC or CRCs generator is coupled to an interface 234 and the packet select 216. The ILS circuit 200 includes an interface physical layer interface 236 coupled to the packet decoder 218.

The packet select 216 determines the next packet to be sent, and selects the next buffer entry to be sent and determines the number of ETE flits to be included with the selected entry when building a final packet. The packet encoder 218 performs packet encoding to add link layer information, such as credits, acknowledges, sequence numbers and other packet fields such as, the CRCs.

The ILR circuit 300 handles receiving all ETE flits on the L and D links 106, 108. The ILR circuit 300 does not include receive buffers, passing ETE flits immediately to interconnect switch 120 and buffered there. The ILR circuit 300 handles early error detection by not validating the packet.

Referring to FIG. 3, the interconnect link layer logic receive (ILR) circuit 300 includes an interface physical layer interface 302 to the iPhy 126. The ILR circuit 300 includes link layer control registers of a link status exchange identification (EXID) 304, a link layer info 306 coupled to ILS 200, idle/header CRC 308 coupled to an error monitoring function 310, which is coupled to ILS 200. The ILR circuit 300 includes a destination (DEST) 312, and PRT1/PRT2 tables used for destination routing to determine the next destination of each incoming local rack interconnect packet. The ILR circuit 300 includes a packet CRC 318 coupled to the error monitoring function 310. The ILR circuit 300 provides pipelined version of flits from iPhy 126 with link layer updates including an interface 320, a reformat/ECC function 322, and an interconnect switch interface 324.

Figure 4A:
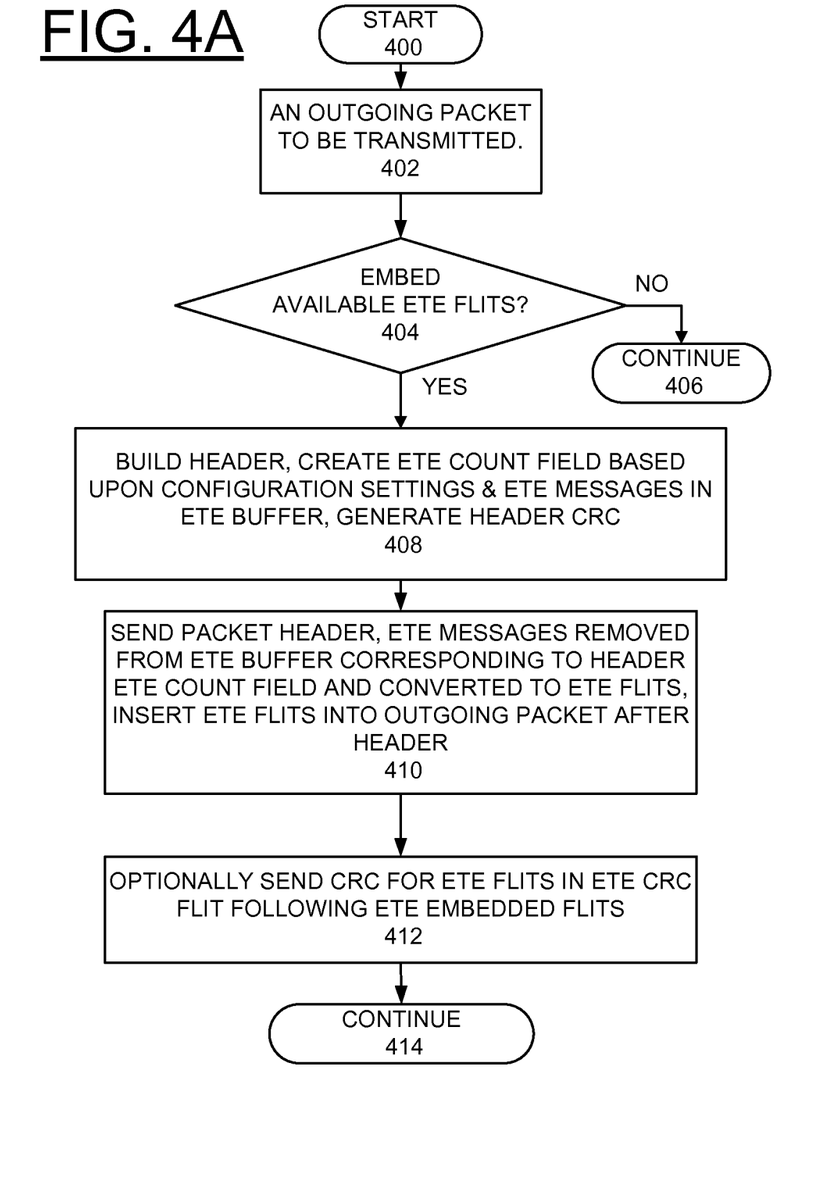
FIGS. 4A and 4B are charts illustrating exemplary operations performed by the circuits of FIGS. 2 and 3 for implementing variable length packets to embed extra control information in accordance with the preferred embodiment.
Figure 4B:
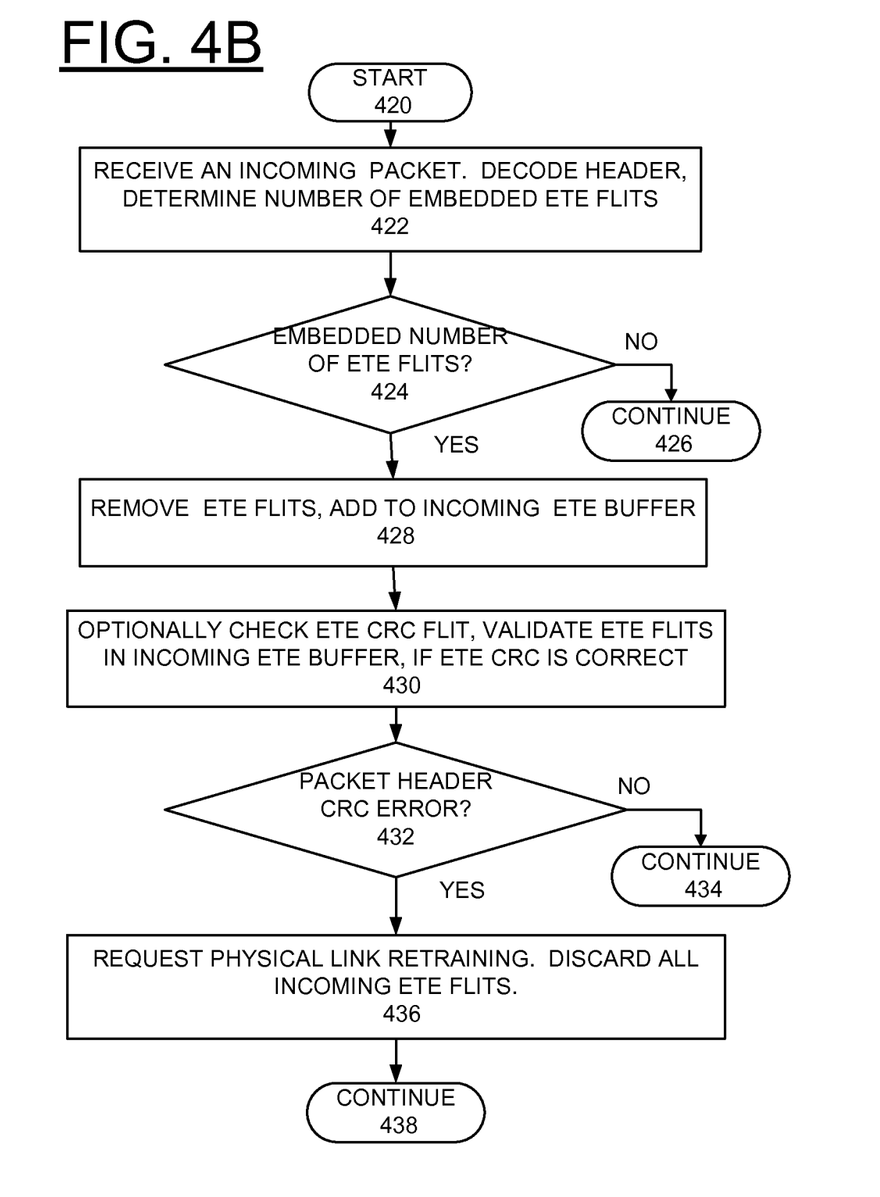

Referring to FIGS. 4A, and 4B, there are shown exemplary operations performed by the circuits 200, 300 for implementing variable length packets to embed extra control information in accordance with the preferred embodiment.

In FIG. 4A, exemplary operations performed by the ILS circuit 200 starting at a block 400 include an outgoing packet to be transmitted as indicated at a block 402. Checking is performed, for example, based upon configuration setting to determine whether to embed available ETE flits in the outgoing packet as indicated at a decision block 404. Settings that can be configured include a maximum number of flits allowed to be embedded for each packet type, and whether embedded flits include CRC. If ETE flits will not be embedded, then the operations continue as indicated at a block 406.

When determined to embed available ETE flits in the outgoing packet at decision block 404, prior to sending the next packet, the packet header is built, and the ETE Flit Count field is created based on the configuration settings and the number of valid ETE messages in the ETE Buffer, and a header CRC is generated as indicated at a block 408. Header creation occurs close to packet send time so that the most up-to-date count of available ETE messages can be used. As the packet is then being transferred on the link, ETE messages are removed from the ETE Buffer (the number as specified in the ETE Flit Count), converted to ETE flits, and inserted into the outgoing packet after the packet header as indicated at a block 410. When a separate CRC flit optionally is provided along with the embedded ETE flits, the CRC for the embedded ETE flits is sent in an ETE CRC flit following the embedded ETE flits as indicated at a block 412. Then the operations continue as indicated at a block 414.

In FIG. 4B, exemplary operations performed by the ILR circuit 300 starting at a block 420 include receiving an incoming packet as indicated at a block 422. Checking is performed, for example, decoding the packet header to identify the number of embedded ETE flits in the incoming packet as indicated at a decision block 424. If ETE flits are not embedded then the ETE flit count is zero, then the operations continue and the packet is processed normally as indicated at a block 426.

When there are embedded flits, the embedded flits are stripped from the packet and added to the incoming ETE buffer as indicated at a block 428. Since the embedded flits are not directly associated with the arriving packet (they are flowing in their own virtual channel, it is possible that the embedded flits can be considered valid even when the encapsulating packet is not, for example, the link may be recovering from a previous CRC error, and the arriving packet is detected as being out-of-order, but otherwise correct. In this case, the ETE flits are processed normally even though the actual packet is discarded. As indicated at a block 430, when the ETE flits are configured to include a CRC flit covering the embedded flits, the CRC is checked and the ETE flits are validated in the ETE buffer if the ETE CRC is correct. If embedded flits do not include CRC, the embedded flits can be validated in the ETE buffer after the packet CRC is verified. Checking for a packet CRC error is performed as indicated at a decision block 432. If the packet CRC error is not identified, then the operations continue and the packet is processed as indicated at a block 434. If the packet CRC error is identified, then physical link retraining is immediately requested and the ETE flits are discarded as indicated at a block 436. Then the operations continue as indicated at a block 438.

Figure 5:
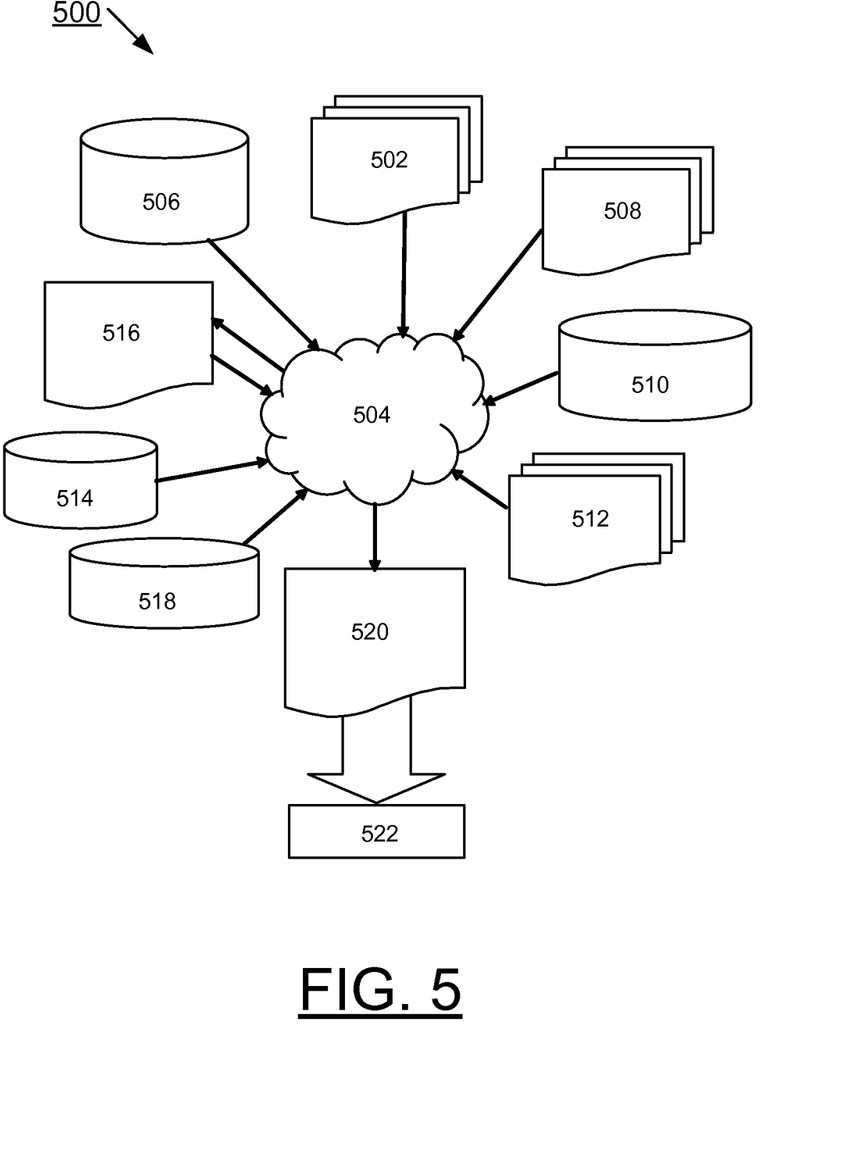
FIG. 5 is a flow diagram of a design process used in semiconductor design, manufacturing, and/or test.

FIG. 5 shows a block diagram of an example design flow 500 that may be used for the variable length packets circuits and the interconnect chip described herein. Design flow 500 may vary depending on the type of IC being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises circuits 102, 200, 300 in the form of schematics or HDL, a hardware-description language, for example, Verilog, VHDL, C, and the like. Design structure 502 may be contained on one or more machine readable medium. For example, design structure 502 may be a text file or a graphical representation of circuits 102, 200, 300. Design process 504 preferably synthesizes, or translates, circuits 102, 200 into a netlist 506, where netlist 506 is, for example, a list of wires, transistors, logic gates, control circuits, I/O, models, etc. that describes the connections to other elements and circuits in an integrated circuit design and recorded on at least one of machine readable medium. This may be an iterative process in which netlist 506 is resynthesized one or more times depending on design specifications and parameters for the circuits.

Design process 504 may include using a variety of inputs; for example, inputs from library elements 508 which may house a set of commonly used elements, circuits, and devices, including models, layouts, and symbolic representations, for a given manufacturing technology, such as different technology nodes, 32 nm, 45 nm, 90 nm, and the like, design specifications 510, characterization data 512, verification data 514, design rules 516, and test data files 518, which may include test patterns and other testing information. Design process 504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 504 without deviating from the scope and spirit of the invention. The design structure of the invention is not limited to any specific design flow.

Design process 504 preferably translates an embodiment of the invention as shown in FIGS. 1A-1E, 2, 3, 4A and 4B along with any additional integrated circuit design or data (if applicable), into a second design structure 520. Design structure 520 resides on a storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A-1E, 2, 3, 4A and 4B. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing variable length packets to embed extra control information in an interconnect system, said interconnect system including a plurality of interconnect chips; a plurality of serial links connected between each of said plurality of interconnect chips for sending packets between a source device and a destination device; said method comprising:
    using said interconnect chips, defining packets to include an End-to-End (ETE) Flow Unit within packet (Flit) count field in a packet header; said ETE Flit count field identifying a specified number of embedded ETE flits;
    receiving an incoming packet from an incoming link;
    checking said ETE flit count field, and responsive to an identified nonzero value in said ETE flit count field identifying said specified number of said embedded ETE flits, removing said specified number of said embedded ETE flits from said incoming packet; and
    using control information from said specified number of said embedded ETE flits being removed from said incoming packet.

2. The method as recited in claim 1 includes sending an ETE cyclic redundancy check (CRC) flit with said specified number of said embedded ETE flits, and said ETE CRC flit being sent covers only said specified number of said embedded ETE flits.

3. The method as recited in claim 1 includes identifying an ETE cyclic redundancy check (CRC) flit, and validating said specified number of said embedded ETE flits responsive to a correct ETE CRC flit.

4. The method as recited in claim 1 includes determining when to embed ETE flits based upon predetermined configuration settings and available ETE messages in an outgoing ETE buffer.

5. The method as recited in claim 4 wherein said predetermined configuration settings include a maximum flits allowed to be embedded for each packet type.

6. The method as recited in claim 4 wherein said predetermined configuration settings include whether embedded flits include a cyclic redundancy check (CRC).

7. The method as recited in claim 1 includes creating said packet header including a header cyclic redundancy check (CRC) for transmitting on an outgoing link.

8. The method as recited in claim 7 includes removing a number of ETE messages from an ETE buffer corresponding to said identified nonzero value in said ETE flit count field identifying said specified number of said embedded ETE flits, converting said removed number of said ETE messages to ETE flits, and inserting said ETE flits into said incoming packet after said packet header.

9. The method as recited in claim 8 includes inserting an ETE cyclic redundancy check (CRC) flit with said removed number of said embedded ETE flits, and said ETE CRC flit being inserted covers only said removed specified number of said embedded ETE flits.

10. The method as recited in claim 1 includes checking a packet header cyclic redundancy check (CRC), and discarding said removed specified number of said embedded ETE flits responsive to an incorrect packet header CRC.

11. A circuit for implementing variable length packets to embed extra control information in an interconnect system comprising:

an interconnect link send circuit transferring an outgoing packet onto an outgoing link, said interconnect link send circuit building a packet header; creating an End-to-End (ETE) Flow Unit within packet (Flit) count field in said packet header; converting ETE messages into ETE flits, and embedding ETE flits into the outgoing packet after the packet header; and an interconnect link receive circuit receiving an incoming packet from an incoming link; checking said ETE flit count field, and responsive to an identified nonzero value in said ETE flit count field, removing a specified number of embedded ETE flits from said incoming packet; and using control information from said removed specific number of said embedded ETE flits.

12. The circuit as recited in claim 11 wherein said interconnect link send circuit creating said packet header includes said interconnect link send circuit generating a packet header cyclic redundancy check (CRC) for said packet header.

13. The circuit as recited in claim 12 includes said interconnect link receive circuit checking said packet header cyclic redundancy check (CRC), and discarding said removed specific number of said embedded ETE flits responsive to an incorrect packet header CRC.

14. The circuit as recited in claim 11 includes said interconnect link send circuit generating an ETE cyclic redundancy check (CRC) flit for said removed specific number of said embedded ETE flits, and inserting said ETE CRC flit into the outgoing packet after said removed specific number of said embedded ETE flits.

15. The circuit as recited in claim 11 includes said interconnect link receive circuit identifying said ETE cyclic redundancy check (CRC) flit, and validating said removed specific number of said embedded ETE flits responsive to a correct ETE CRC flit.

16. The circuit as recited in claim 11 includes said interconnect link send circuit determining when to embed ETE flits based upon predetermined configuration settings and available ETE messages in an outgoing ETE buffer.

17. A multiple-path local rack interconnect system comprising:

a plurality of interconnect chips; each of said interconnect chips including a source interconnect chip coupled to a source device and a destination interconnect chip coupled to a destination device;

a plurality of serial links connected between each of said plurality of interconnect chips for sending packets between a source device and a destination device multiple-path local rack interconnect system;

each of said interconnect chips including a circuit for implementing variable length packets to embed extra control information, said circuit comprising:

an interconnect link send circuit transferring an outgoing packet onto an outgoing link, said interconnect link send circuit building a packet header; creating an End-to-End (ETE) Flow Unit within packet (Flit) count field in said packet header; converting ETE messages into ETE flits, and embedding ETE flits into the outgoing packet after the packet header; and an interconnect link receive circuit receiving an incoming packet from an incoming link; checking said ETE flit count field, and responsive to an identified nonzero value in said ETE flit count field, removing a specified number of embedded ETE flits from said incoming packet; and using control information from said removed specific number of said embedded ETE flits.

18. The multiple-path local rack interconnect system as recited in claim 17 includes said interconnect link send circuit generating an ETE cyclic redundancy check (CRC) flit for said removed specific number of said embedded ETE flits, and inserting said ETE CRC flit into the outgoing packet after said removed specific number of said embedded ETE flits.

19. The multiple-path local rack interconnect system as recited in claim 18 includes said interconnect link receive circuit identifying said ETE cyclic redundancy check (CRC) flit, and validating said removed specific number of said embedded ETE flits responsive to a correct ETE CRC flit.

20. A design structure embodied in a non-transitory machine readable medium used in a design process, the design structure comprising:

a circuit tangibly embodied in the non-transitory machine readable medium used in the design process comprising:

an interconnect link send circuit transferring an outgoing packet onto an outgoing link, said interconnect link send circuit building a packet header; creating an End-to-End (ETE) Flow Unit within packet (Flit) count field in said packet header; converting ETE messages into ETE flits, and embedding ETE flits into the outgoing packet after the packet header; and an interconnect link receive circuit receiving an incoming packet from an incoming link; checking said ETE flit count field, and responsive to an identified nonzero value in said ETE flit count field, removing a specified number of embedded ETE flits from said incoming packet; and using control information from said removed specific number of said embedded ETE flits, wherein the design structure, when read and used in manufacture of a semiconductor chip produces a chip comprising said interconnect link send circuit and said interconnect link receive circuit.

21. The design structure of claim 20, wherein the design structure comprises a netlist, which describes said interconnect link send circuit and said interconnect link receive circuit.

22. The design structure of claim 20, wherein the design structure resides on non-transitory storage medium as a data format used for exchange of layout data of integrated circuits.

23. The design structure of claim 20, wherein the design structure includes at least one of test data files, characterization data, verification data, or design specifications.

24. The design structure of claim 20, wherein said interconnect link receive circuit checks an ETE cyclic redundancy check (CRC) flit for said embedded ETE flits, and validates said specific number of said embedded ETE flits responsive to a correct ETE CRC flit.

\* \* \* \* \*